US008947289B2

(12) United States Patent
Yang et al.

(10) Patent No.: US 8,947,289 B2
(45) Date of Patent: Feb. 3, 2015

(54) METHOD OF PRODUCING LOW-POWER SWITCHED-CAPACITOR AMPLIFIER, CIRCUIT AND A PIPELINE ANALOG-TO-DIGITAL CONVERTER INCLUDING THE SAME

(71) Applicant: Greenvity Communications, Inc., Milpitas, CA (US)

(72) Inventors: Junjie Yang, Cupertino, CA (US); John Tero, San Jose, CA (US)

(73) Assignee: Greenvity Communications, Inc., Milpitas, CA (US)

( * ) Notice: Subject to any disclaimer, the term of this patent is extended or adjusted under 35 U.S.C. 154(b) by 22 days.

(21) Appl. No.: 13/962,976

(22) Filed: Aug. 9, 2013

(65) Prior Publication Data

US 2014/0176358 A1  Jun. 26, 2014

Related U.S. Application Data

(60) Provisional application No. 61/681,588, filed on Aug. 9, 2012.

(51) Int. Cl.
*H03M 1/12* (2006.01)
*H03F 3/00* (2006.01)

(52) U.S. Cl.
CPC ............ *H03F 3/005* (2013.01); *H03M 1/1245* (2013.01)
USPC ........................... 341/172; 341/155; 341/161

(58) Field of Classification Search
CPC ..... H03M 1/12; H03M 1/403; H03M 1/0682; H03M 1/44; H03M 1/466; H03M 1/442; H03M 1/145; H03M 1/162; H03M 1/00

USPC .......................................... 341/155, 161, 172
See application file for complete search history.

(56) References Cited

U.S. PATENT DOCUMENTS

| | | | | |
|---|---|---|---|---|
| 5,574,457 | A * | 11/1996 | Garrity et al. ................. | 341/172 |
| 5,764,176 | A * | 6/1998 | Ginetti .......................... | 341/161 |
| 6,166,675 | A * | 12/2000 | Bright ........................... | 341/162 |
| 7,034,737 | B1 * | 4/2006 | Huang .......................... | 341/172 |
| 7,187,310 | B2 * | 3/2007 | El-Sankary et al. .......... | 341/120 |
| 7,372,391 | B1 * | 5/2008 | Courcy et al. ................. | 341/161 |
| 7,612,701 | B2 * | 11/2009 | Cho et al. ...................... | 341/161 |
| 7,822,160 | B1 * | 10/2010 | Cho et al. ...................... | 375/355 |
| 2006/0044172 | A1 * | 3/2006 | Sasaki et al. .................. | 341/161 |
| 2006/0077086 | A1 * | 4/2006 | Cringean ...................... | 341/155 |
| 2007/0103203 | A1 * | 5/2007 | Makihara ...................... | 327/94 |
| 2009/0146854 | A1 * | 6/2009 | Kawahito et al. ............. | 341/120 |
| 2009/0189796 | A1 * | 7/2009 | Chen et al. .................... | 341/120 |
| 2009/0278716 | A1 * | 11/2009 | Kawahito et al. ............. | 341/120 |
| 2013/0127646 | A1 * | 5/2013 | Kumar et al. ................. | 341/110 |

* cited by examiner

*Primary Examiner* — Linh Nguyen
(74) *Attorney, Agent, or Firm* — Perkins Coie LLP

(57) ABSTRACT

A switched-capacitor amplifier comprises an operational amplifier (op-amp), a first capacitor, a second capacitor, a third capacitor, a fourth capacitor and a plurality of switches connected to these capacitors. The first capacitor equals the third capacitor, the second capacitor equals the fourth capacitor, and the first capacitor is asymmetric to the second capacitor, the third capacitor is asymmetric to the fourth capacitor. A ratio of the first capacitor and the second capacitor is a function of a simulated parasitic capacitance of the switched-capacitor amplifier, a simulated DC gain of the operational amplifier, and a target gain of the switched-capacitor circuit.

5 Claims, 15 Drawing Sheets

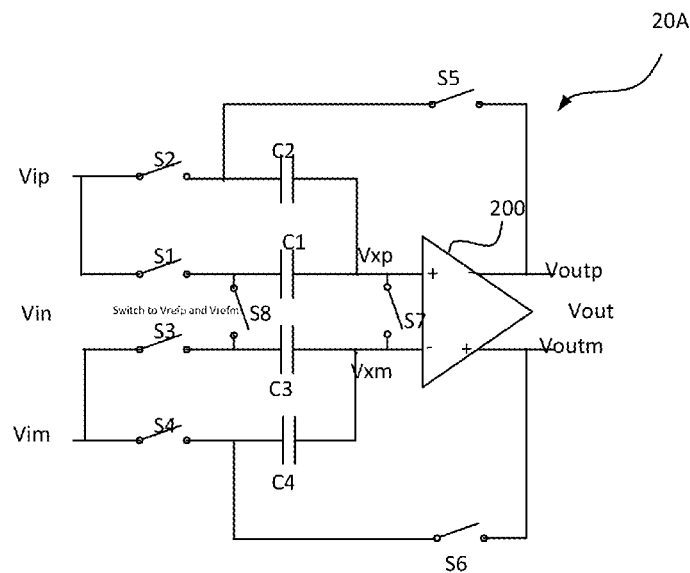
FIG.2A
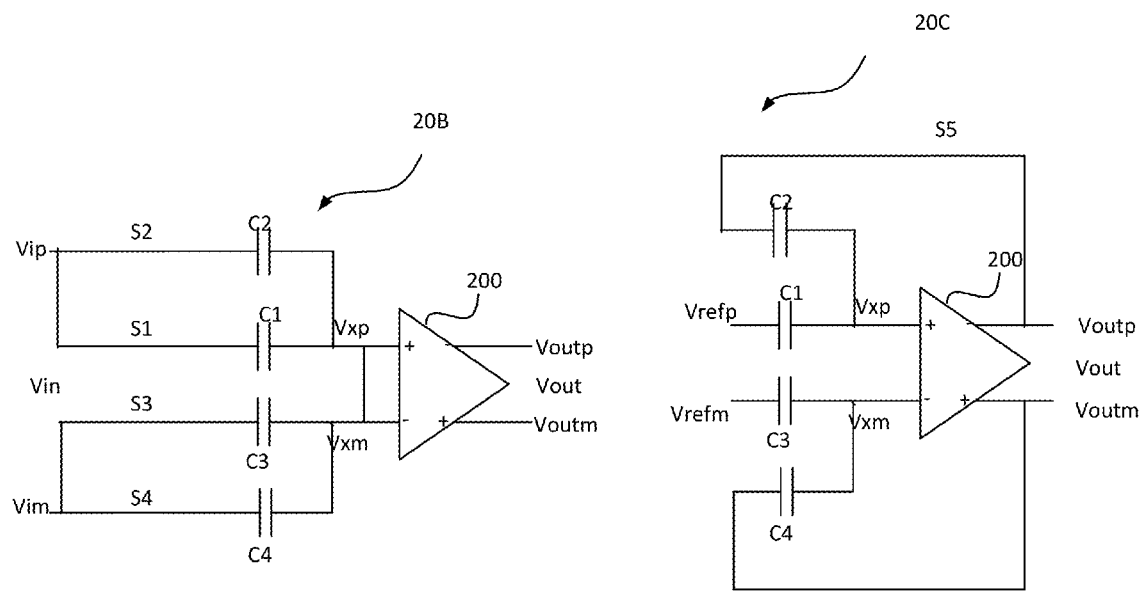
FIG.2B
FIG.2C

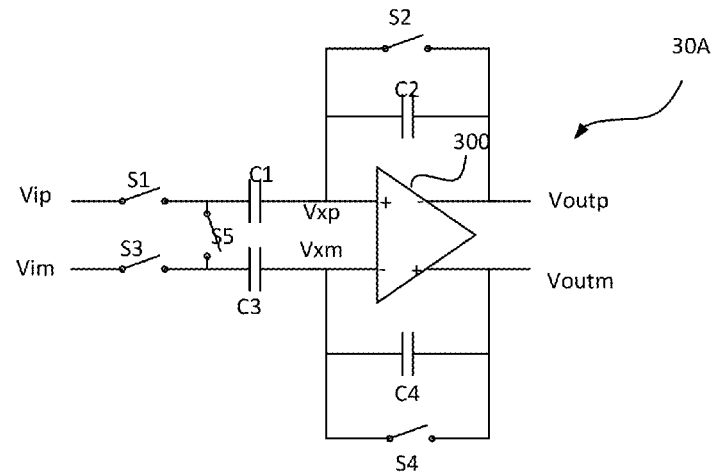
FIG.3A
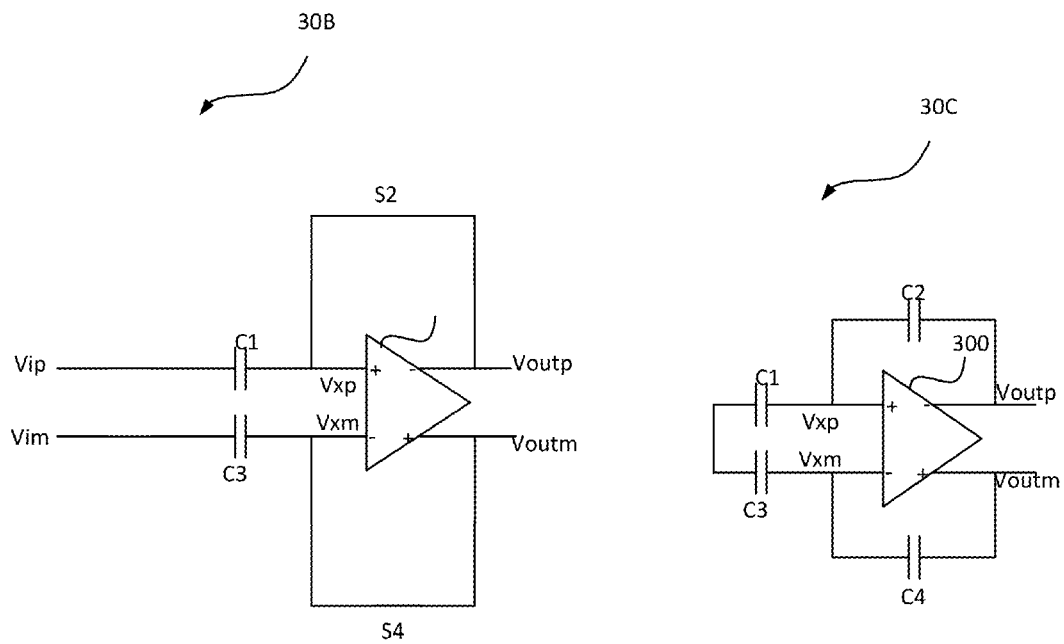
FIG.3B
FIG.3C

METHOD OF PRODUCING LOW-POWER SWITCHED-CAPACITOR AMPLIFIER, CIRCUIT AND A PIPELINE ANALOG-TO-DIGITAL CONVERTER INCLUDING THE SAME

CROSS-REFERENCE TO RELATED APPLICATION(S)

The present application claims the benefit of and incorporates by reference U.S. provisional application No. 61/681,588, filed on Aug. 9, 2012.

TECHNICAL FIELD

The present application relates to signal amplifying, and more particularly, but not exclusively, to switched-capacitor circuit and pipeline Analog-To-Digital Converter including the switched-capacitor circuit.

BACKGROUND

The switched-capacitor amplifier is an electronic circuit element used for discrete-time signal processing. It works by moving charges into and out of capacitors when switches are opened and closed. Normally, the switched-capacitor amplifier is required to have fixed and accurate gain. However, one disadvantage for this circuit is that it burns a lot of power, mostly consumed by operational amplifier (opamp). The reason lies in that to achieve the target resolution, common practice is to employ very high-gain opamp (>80 dB) in addition to keep good matching between capacitors, so that the effects of limited gain and parasitic input capacitance of opamp can be ignored. The high-gain opamp usually needs three stages to implement. This makes opamp design complicated, requiring more branches to provide biasing current and extra common-mode feedback circuits to control the common-mode level at middle stages. All these factors contribute to the high power consumption. To make it worse, for stability issue, Miller-compensation is usually utilized and it also increases the probability of gain peaking and pole/zero interaction.

Therefore, an innovative design for switched-capacitor circuit is desirable.

SUMMARY

According to a first embodiment of the invention, a first switched-capacitor circuit comprises a first operational amplifier (op-amp); a first capacitor; a second capacitor. The first capacitor is connected between a first input terminal of the first operational amplifier and a first input terminal of the first switched-capacitor circuit in a first predetermined period. The first capacitor is connected between a first node and the first input terminal of the first operational amplifier in a second predetermined period which is different from the first predetermined period. The second capacitor is connected between the first input terminal of the first operational amplifier and a first output terminal of the first operational amplifier in the second predetermined period. The first capacitor is asymmetric to the second capacitor. A ratio of the first capacitor and the second capacitor is a function of a simulated parasitic capacitance of the circuit, a simulated gain of the first operational amplifier, and a target gain of the switched-capacitor circuit.

In this embodiment, since the ratio of first capacitor and the second capacitor is a function of a simulated parasitic capacitance of the circuit, a simulated gain of the first operational amplifier, and a target gain of the switched-capacitor circuit, the gain of the first operational amplifier can be relatively small with less amplifying stage. Therefore the overall power consumption for the first switched-capacitor circuit can be reduced.

According to another embodiment of the invention, a method, comprises configuring in a first predetermined period both the first capacitor and the second capacitor to be connected in parallel between a positive input terminal of the first operational amplifier and a positive input terminal of the first switched-capacitor circuit; configuring in the first predetermined period both a third capacitor and a fourth capacitor to be connected in parallel between a negative input terminal of the first operational amplifier and a negative input terminal of the first switched-capacitor circuit, and configuring in the first predetermined period a voltage level of the positive input terminal of the first operational amplifier to equal a voltage level of the negative input terminal of the first operational amplifier; configuring in a second predetermined period which is different from the first predetermined period the first capacitor to be connected between a positive reference voltage and the positive input terminal of the first operational amplifier; configuring in the second predetermined period the third capacitor to be connected between the negative input terminal of the first operational amplifier and a negative reference voltage; configuring in a second predetermined period the second capacitor to be connected between the positive input terminal of the first operational amplifier and a positive output terminal of the first operational amplifier; configuring in the second predetermined period the fourth capacitor to be connected between the negative input terminal of the first operational amplifier and a negative output terminal of the first operational amplifier; and wherein the first capacitor equals the third capacitor, the second capacitor equals the fourth capacitor, and the first capacitor is asymmetric to the second capacitor, the third capacitor is asymmetric to the fourth capacitor; wherein a ratio of the first capacitor and the second capacitor is a function of a simulated parasitic capacitance of the circuit, a simulated gain of the first operational amplifier, and a target gain of the switched-capacitor circuit.

A pipeline Analog-To-Digital Converter, comprising a sample/hold(S/H) unit, a plurality of Multiplying Digital-To-Analog (MDAC) units; wherein at least a plurality of MDAC units comprises two comparators, a DAC and a second switched-capacitor amplifier; and the remaining at least one MDAC unit comprises two comparators, a DAC and a first switched-capacitor amplifier, wherein each of the first switched-capacitor amplifier comprises: a first operational amplifier (op-amp); a first capacitor; a second capacitor; a third capacitor; and a fourth capacitor; wherein both the first capacitor and the second capacitor are configured in a first predetermined period to be connected in parallel between a positive input terminal of the first operational amplifier and a positive input terminal of the first switched-capacitor amplifier; both the third capacitor and a fourth capacitor are configured in the first predetermined period to be connected in parallel between a negative input terminal of the first operational amplifier and a negative input terminal of the first switched-capacitor amplifier, and a voltage level of the positive input terminal of the first operational amplifier is configured in the first predetermined period to equal a voltage level of the negative input terminal of the first operational amplifier; the first capacitor is configured in a second predetermined period which is different from the first predetermined period to be connected between a positive reference voltage and the positive input terminal of the first operational amplifier; the third capacitor is configured in the second predetermined period to be connected between the negative input terminal of the first operational amplifier and a negative reference voltage; the second capacitor is configured in a second predetermined period to be connected between the positive input terminal of the first operational amplifier and a positive output terminal of the first operational amplifier; the fourth capacitor is configured in the second predetermined period to be connected between the negative input terminal of the first operational amplifier and a negative output terminal of the first operational amplifier; and wherein the first capacitor equals the third capacitor, the second capacitor equals the fourth capacitor, and the first capacitor is asymmetric to the second capacitor, the third capacitor is asymmetric to the fourth capacitor; wherein a ratio of the first capacitor and the second capacitor is a function of a simulated parasitic capacitance of the switched-capacitor amplifier, a simulated gain of the first operational amplifier, and a target gain of the switched-capacitor; wherein each of the second switched-capacitor amplifier comprises: a second operational amplifier (op-amp); a fifth capacitor; a sixth capacitor; a seventh capacitor; an eighth capacitor; wherein both the fifth capacitor and the sixth capacitor are configured in a third predetermined period to be connected in parallel between a positive input terminal of the second operational amplifier and a positive input terminal of the first switched-capacitor; both the seventh capacitor and the eighth capacitor are configured to in the third predetermined period be connected in parallel between a negative input terminal of the second operational amplifier and a negative input terminal; and a voltage level of the positive input terminal of the second operational amplifier is configured in the third predetermined period to equal a voltage level of the negative input terminal of the second operational amplifier; and the fifth capacitor is configured in a fourth predetermined period which is different from the third predetermined period to be connected between a positive reference voltage and the positive input terminal of the first operational amplifier; and the seventh capacitor is configured in the fourth predetermined period to be connected between the negative input terminal of the second operational amplifier and a negative reference voltage; the sixth capacitor is configured in the fourth predetermined period to be connected between the positive input terminal of the operational amplifier and a positive output terminal of the second operational amplifier, and the eighth capacitor is configured in the fourth predetermined period to be connected between the negative input terminal of the operational amplifier and a negative output terminal of the second operational amplifier; and wherein the fifth, the sixth, the seventh and the eighth capacitors are symmetric to each other; and wherein a ratio of the fifth capacitor and the sixth capacitor is a function of a target gain of the second switched-capacitor amplifier.

BRIEF DESCRIPTION OF THE DRAWINGS

One or more embodiments of the present invention are illustrated by way of example and not limitation in the figures of the accompanying drawings, in which like references indicate similar elements.

FIG. 2A is a diagram illustrating a switched-capacitor circuit 20A according to an embodiment of the invention.

FIG. 2B is a diagram illustrating another configuration of a switched-capacitor circuit 20B according to an embodiment of the invention.

FIG. 2C is a diagram illustrating another configuration of a switched-capacitor circuit 20C according to an embodiment of the invention.

FIG. 3A is a diagram illustrating a switched-capacitor circuit 30A according to an embodiment of the invention.

FIG. 3B is a diagram illustrating another configuration of a switched-capacitor circuit 30B according to an embodiment of the invention.

FIG. 3C is a diagram illustrating another configuration of a switched-capacitor circuit 30C according to an embodiment of the invention.

DETAILED DESCRIPTION

References in this description to "an embodiment," "one embodiment," or the like, mean that the particular feature, function, structure or characteristic being described is included in at least one embodiment of the present invention. Occurrences of such phrases in this specification do not necessarily all refer to the same embodiment. On the other hand, such references are not necessarily mutually exclusive either.

Figure 1A:
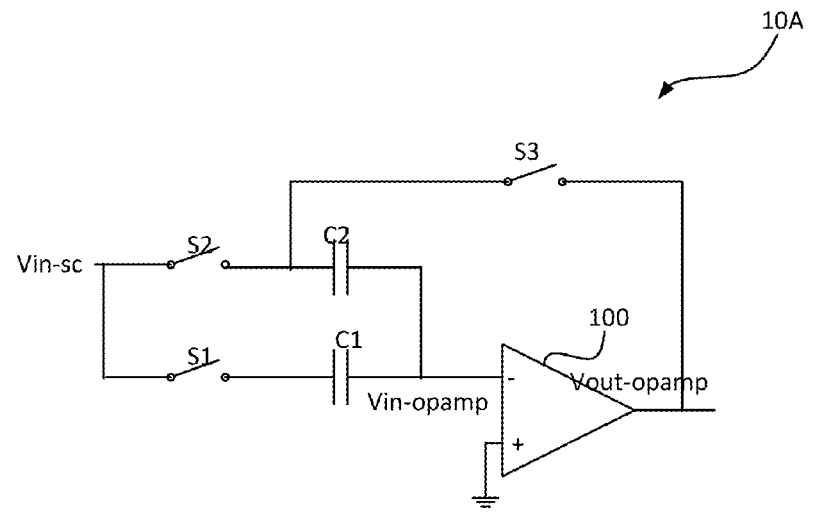
FIG. 1A is a diagram illustrating a switched-capacitor circuit 10A according to an embodiment of the invention.

FIG. 1A shows a diagram illustrating a first switched-capacitor circuit 10 according to an embodiment of the invention. The switched-capacitor circuit 10 comprises a first operational amplifier (op-amp) 100, a first capacitor $C_1$, and a second capacitor $C_2$. The first capacitor $C_1$ is connected between a first input terminal $V_{in\text{-}opamp}$ of the first operational amplifier 100 and a first input terminal $V_{in\text{-}sc}$ of the first switched-capacitor circuit 10 in a first predetermined period. Further, the first capacitor $C_1$ is connected between the ground and the first input terminal $V_{in\text{-}opamp}$ of the first operational amplifier 100 in a second predetermined period. The second predetermined period is different from the first predetermined period. The second capacitor $C_2$ is connected between the first input terminal $V_{in\text{-}opamp}$ of the first operational amplifier 100 and a first output terminal $V_{out\text{-}opamp}$ of the first operational amplifier 100 in the second predetermined period.

Figure 1B:
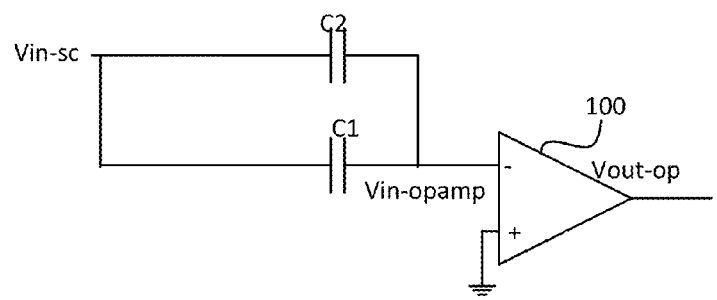
FIG. 1B is a diagram illustrating another configuration of a switched-capacitor circuit 10B according to an embodiment of the invention.

FIG. 1B is a diagram illustrating another configuration of a switched-capacitor circuit 10B according to an embodiment of the invention. In the first predetermined period, switches S1 and S2 are on and switch S3 is off, yielding an equivalent circuit of FIG. 1B. In the first predetermined period, the switched-capacitor circuit samples the input, setting the output to zero, and providing no amplification during this period. Therefore the first predetermined period corresponds to sampling period.

Figure 1C:
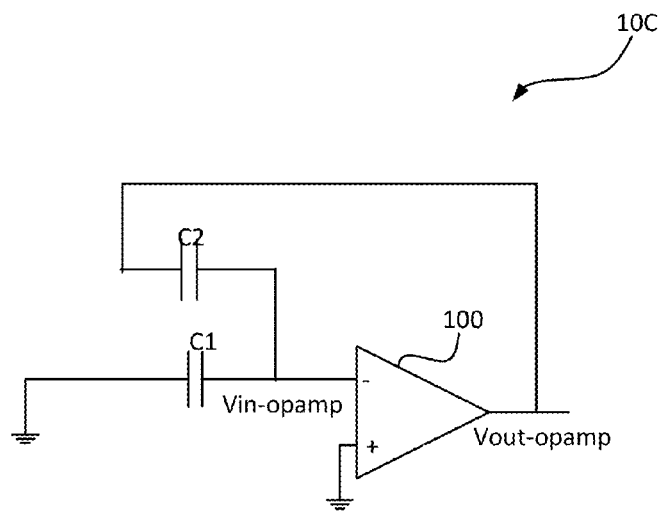
FIG. 1C is a diagram illustrating another configuration of a switched-capacitor circuit 10C according to an embodiment of the invention.

FIG. 1C is a diagram illustrating another configuration of a switched-capacitor circuit 10C according to an embodiment of the invention. Then, in the second predetermined period, switches S1 and S2 are off and switch S3 is on, yielding an equivalent circuit of FIG. 1C. In the second predetermined period, the switched-capacitor circuit ignores the input $V_{in-sc}$, amplifying the sampled voltage. Therefore, the second predetermined period corresponds to an amplifying period.

The first switched capacitor circuit 10 further comprises a first switch S1 positioned between the first input terminal $V_{in-sc}$ of the first switched-capacitor circuit and a first plate of the first capacitor, a second switch S2 positioned between the first input terminal $V_{in-sc}$ of the first switched-capacitor circuit and a first plate of the second capacitor $C_2$, and a third switch S3 positioned between the first plate of the second capacitor and the output terminal $V_{out-opamp}$ of the first operational amplifier. Both the first and second switches S1 and S2 are on and the third switch S3 is off in the first predetermined period. Both the first and second switches S1 and S2 are off and the third switch S3 is on in the second predetermined period.

In FIGS. 1A, 1B and 1C, the first capacitor $C_1$ is asymmetric to the second capacitor $C_2$. A ratio of the first capacitor $C_1$ and the second capacitor $C_2$ is a function of a simulated parasitic capacitance $C_p$ of the circuit, a simulated gain $A_{opamp}$ of the first operational amplifier, and a target gain $G_{target}$ of the switched-capacitor circuit. The details for calculating the ratio between the capacitance of the first capacitor $C_1$ and the capacitance of the second capacitor will be discussed in the followings.

Those having ordinary skill in the art should understand that $C_1$ and $C_2$ are asymmetric means that the two capacitors have different parameters and/or layout, such as width-length ratio, therefore their capacitances are consequently not equal. By contrast, $C_1$ and $C_2$ are symmetric means that the two capacitors have same parameters and layout, such as width-length ratio, therefore their capacitances are consequently equal.

FIG. 2A is a diagram illustrating a switched-capacitor circuit 20A according to another embodiment of the invention. The switched-capacitor circuit 20A comprises a first operational amplifier (op-amp) 200, a first capacitor $C_1$, a second capacitor $C_2$, a third capacitor $C_3$, a fourth capacitor $C_4$. Both the first capacitor $C_1$ and the second capacitor $C_2$ are connected in parallel between a positive input terminal $V_{xp}$ of the first operational amplifier 200 and a positive input terminal $V_{ip}$ in a first predetermined period. Both the third capacitor $C_3$ and the fourth capacitor $C_4$ are connected in parallel between a negative input terminal $V_{xm}$ of the first operational amplifier 200 and a negative input terminal Vim in the first predetermined period. The positive input terminal $V_{xp}$ of the first operational amplifier 200 is shorted with the negative input terminal $V_{xm}$. Therefore, a voltage level of the positive input terminal of the first operational amplifier equals a voltage level of the negative input terminal of first operational amplifier in the first predetermined period. The equivalent circuit in the first predetermined period is shown in FIG. 2B.

Further, the first capacitor $C_1$ is connected between a positive reference voltage $V_{refp}$ and the positive input terminal $V_{xp}$ of the first operational amplifier 200. The third capacitor $C_3$ is connected between a negative reference voltage $V_{refn}$ and the negative input terminal $V_{xm}$ of the first operational amplifier 200 in a second predetermined period which is different from the first predetermined period. The second capacitor $C_2$ is connected between the positive input terminal $V_{xp}$ of the first operational amplifier 200 and a positive output terminal $V_{outp}$ of the first operational amplifier 200 in the second predetermined period. The fourth capacitor $C_4$ is connected between the negative input terminal $V_{xm}$ of the first operational amplifier 200 and a negative output terminal $V_{outm}$ of the first operational amplifier 200 in the second predetermined period. The equivalent circuit in the second predetermined period is shown in FIG. 2C.

Further, the first capacitor $C_1$ equals the third capacitor $C_3$. The second capacitor $C_2$ equals the fourth capacitor $C_4$. The first capacitor $C_1$ is asymmetric to the second capacitor $C_2$. The third capacitor $C_3$ is asymmetric to the fourth capacitor $C_4$. A ratio of the first capacitor $C_1$ and the second capacitor $C_2$ is a function of a simulated parasitic capacitance of the circuit $C_p$, a simulated gain $A_{opamp}$ of the first operational amplifier 200, and a target gain $G_{target}$ of the switched-capacitor circuit 20A.

Alternatively or additionally, referring back to FIG. 2A, a first switch S1 is disposed between a first plate of the first capacitor $C_1$ and the positive input terminal $V_{ip}$ of the first switched-capacitor circuit 20A. A second switch S2 is disposed between a first plate of the second capacitor $C_2$ and the positive input terminal $V_{ip}$ of the first switched-capacitor circuit 20A. A third switch S3 is disposed between a first plate of the third capacitor $C_3$ and the negative input terminal $V_{im}$ of the first switched-capacitor circuit 20A. A fourth switch S4 is disposed between a first plate of the fourth capacitor $C_4$ and the negative input terminal $V_{im}$ of the first switched-capacitor circuit 20A.

A fifth switch S5 is disposed between the first plate of the second capacitor $C_2$ and the positive output terminal $V_{outp}$ of the first operational amplifier 200. A sixth switch S6 is disposed between the first plate of the fourth capacitor $C_4$ and the negative output terminal $V_{outm}$ of the first operational amplifier. A seventh switch S7 is disposed between a second plate of the first capacitor $C_1$ and a second plate of the third capacitor $C_3$. An eighth switch S8 is disposed between the first plate of the first capacitor $C_1$ and the first plate of the third capacitor $C_3$.

The first, the second, the third, the fourth and the seventh switches S1, S2, S3, S4 and S7 are on in the first predetermined period, and the fifth, the sixth and the eighth switches S5, S6, S8 are off in the first predetermined period. The first, the second, the third, the fourth and the seventh switches S1, S2, S3, S4 and S7 are off in the second predetermined period, and the fifth, the sixth and the eighth switches S5, S6, S8 are on in the second predetermined period.

This switched-capacitor circuit 20A works as follows: at the first predetermined period, switches S1, S2, S3, S4 and S7 are on and switches S5, S6, S8 are off, both positive and negative input terminals of the operational amplifier 200 are connected to common-mode voltage level. The charges on positive input terminal and negative input terminal are respectively:

$$Q_p = (V_{ip} - V_{cm})(C_1 + C_2) + (0 - V_{cm})C_p \qquad (1)$$

$$Q_m = (V_{im} - V_{cm})(C_1 + C_2) + (0 - V_{cm})C_p \qquad (2)$$

Here $C_p$ is the parasitic capacitance at opamp input terminal, $V_{cm}$ is the common-mode voltage level, wherein $$V_{cm} = \frac{V_{xp} + V_{xm}}{2}.$$

At the second predetermined period, switches S1, S2, S3, S4 and S7 are off and S5, S6, S8 are on, the charges on positive and negative inputs are changed to $$Q'_p = (V_{refp} - V_{xp})C_1 + (V_{op} - V_{xp})C_2 + (0 - V_{xp})C_p \quad (3)$$

$$Q'_m = (V_{refm} - V_{xm})C_1 + (V_{om} - V_{xm})C_2 + (0 - V_{xm})C_p \quad (4)$$

Here $V_{xp}$ and $V_{xm}$ are voltage level at positive and negative input terminals of the first operational amplifier at the second predetermined period.

Since charges keep constant at first and second predetermined periods, the followings are satisfied:

$$Q_p = Q'_p \quad (5)$$

$$Q_m = Q'_m \quad (6)$$

Assume the DC gain of the opamp is $A_{opamp}$, then at the second predetermined period, $$A_{opamp}(V_{xp} - V_{xm}) = V_{op} - V_{om} \quad (7)$$

From the equations (1)(2)(3)(4)(5)(6)(7), we have $$V_{op} - V_{om} = (V_{ip} - V_{im})\frac{C_1 + C_2}{C_2 + \frac{C_1 + C_2 + C_p}{A_{opamp}}} + V_{ref}\frac{C_1}{C_2 + \frac{C_1 + C_2 + C_p}{A_{opamp}}} \quad (8)$$

In equation (8), the first item $$\frac{C_1 + C_2}{C_2 + \frac{C_1 + C_2 + C_p}{A_{opamp}}}$$

implements the gain of the switched-capacitor opamp which is also represented as $G_{target}$, the second item $$V_{ref}\frac{C_1}{C_2 + \frac{C_1 + C_2 + C_p}{A_{opamp}}}$$

is a constant, as $V_{ref}$ is a constant voltage level.

In conventional switched-capacitor amplifier applications, the following requirements are always satisfied:

(1) Ensure $C_1 = C_2$, or $C_1$ is symmetrical to $C_2$; It is guaranteed with high matching factor during processing;

(2) Set the gain of opamp high enough (typically >80 dB, or A>10000); and (3) Reduce parasitic capacitance $C_p$ of inputs of opamp.

The conditions (2) and (3) are needed in order to make the second item of denominator in gain expression in equation (8), or $$\frac{C_1 + C_2 + C_p}{A_{opamp}},$$

negligible compared to the first item, $C_2$. Based on that, the condition (1) ensures the accuracy of the gain number. The high-gain requirement (with low-voltage power supply together) requires multiple-stage opamp and large branch current (High gain needs high transconductance (gm) transistors which are translated into high biasing currents.), and as a result, the high power consumption of the opamp. In addition, the conventional design is more vulnerable to stability issue as more stages and loops are incorporated.

In the embodiment of the invention, the first capacitor C1 can be asymmetrical to the second capacitor C2, and the requirements for (2) and (3) are relaxed. That means asymmetrical capacitors for $C_1$ and $C_2$ are used, and the target gain $G_{target}$ of switched-capacitor opamp can still be met.

In a design scenario, for example, in a case where gain $G_{target}$ equals 2, there is:

$$G_{target} = \frac{C_1 + C_2}{C_2 + \frac{C_1 + C_2 + C_p}{A_{opamp}}} = 2 \quad (9)$$

In embodiments of the invention, the second item of denominator $$\frac{C_1 + C_2 + C_p}{A_{opamp}}$$

is not negligible. Instead, this item $$\frac{C_1 + C_2 + C_p}{A_{opamp}}$$

is taken into consideration. The ratio between $C_1$ and $C_2$ is carefully select to meet equation (9).

Further, the gain $A_{opamp}$ can be relatively smaller than 80 dB, therefore a moderate-gain opamp will suffice instead of a high-gain opamp. For example, the gain $A_{opamp}$ may range from about 40 dB to 80 dB. The asymmetrical capacitors can offset the effects of opamp gain $A_{opamp}$ and parasitic capacitance $C_p$ at opamp input.

Even condition (1) $C_1 = C_2$ is not met, layout skills can still be applied to keep the accuracy of the ratio of $$\frac{C_1}{C_2}.$$

For example, when a design $$\frac{C_1}{C_2} = 1.43$$

is desired, the layout of $C_1$ can be divided into 143 units and $C_2$ with 100 units, while all units of both capacitors are symmetrical. In this manner the accuracy level of equation (9) can still be secured.

Therefore a moderate-gain opamp (probably only one stage) is targeted. Then simulating to obtain its gain value $A_{opamp}$ and parasitic capacitance $C_p$, then derive the ratio $$\frac{C_1}{C_2}$$

from equation (9).

The benefit of embodiments of the invention may comprise reducing the design complexity of opamp with less circuit stages and common mode feedback (CMFB, which often exist in multi-stage opamp) loops, improving the stability, as embodiments of the invention exhibit higher phase margin, contrary to the conventional way which increases gain of the opamp and decreases the parasitic capacitance, in embodiment of the invention, the actual number of both the gain and parasitic capacitance are taken into consideration in designing the ratio of capacitors to cancel the effects of limited opamp gain and parasitic capacitance on the overall gain of the switched-capacitor, the power consumption of the opamp is reduced, which usually accounts for a large percentage of the whole circuit system. Further, with layout skills, the accuracy is still kept at a certain level.

FIG. 3A is a diagram illustrating a switched-capacitor circuit 30A according to another embodiment of the invention. The switched-capacitor circuit 30A comprises a first operational amplifier (op-amp) 300, a first capacitor $C_1$, a second capacitor $C_2$, a third capacitor $C_3$, a fourth capacitor $C_4$. The first capacitor $C_1$ is connected between a positive input terminal $V_{xp}$ of the first operational amplifier 300 and a positive input terminal $V_{ip}$ in a first predetermined period. The third capacitor $C_3$ is connected between a negative input terminal $V_{xm}$ of the first operational amplifier 300 and a negative input terminal Vim in the first predetermined period. The positive input terminal $V_{xp}$ of the first operational amplifier 300 is shorted with the positive output terminal $V_{outp}$. The negative input terminal $V_{xm}$ of the first operational amplifier 300 is shorted with the negative output terminal $V_{outm}$. The equivalent circuit in the first predetermined period is shown in FIG. 3B.

Further, both the first capacitor $C_1$ and the third capacitor $C_3$ are connected in serial between the positive input terminal $V_{xp}$ and the negative input terminal Vxm of the first operational amplifier 300 in a second predetermined period which is different from the first predetermined period. The second capacitor $C_2$ is connected between the positive input terminal $V_{xp}$ of the first operational amplifier 300 and a positive output terminal $V_{outp}$ of the first operational amplifier 300 in the second predetermined period. The fourth capacitor $C_4$ is connected between the negative input terminal $V_{xm}$ of the first operational amplifier 300 and a negative output terminal $V_{outm}$ of the first operational amplifier 300 in the second predetermined period. The equivalent circuit in the second predetermined period is shown in FIG. 3C.

Further, the first capacitor $C_1$ equals the third capacitor $C_3$. The second capacitor $C_2$ equals the fourth capacitor $C_4$. The first capacitor $C_1$ is asymmetric to the second capacitor $C_2$. The third capacitor $C_3$ is asymmetric to the fourth capacitor $C_4$. A ratio of the first capacitor $C_1$ and the second capacitor $C_2$ is a function to a simulated parasitic capacitance of the circuit $C_p$, a simulated gain $A_{opamp}$ of the first operational amplifier 300, and a target gain $G_{target}$ of the switched-capacitor circuit 30A.

Alternatively or additionally, referring back to FIG. 3A, a first switch S1 is disposed between a first plate of the first capacitor $C_1$ and the positive input terminal $V_{ip}$ of the first switched-capacitor circuit 30A. A second switch S2 is disposed between the positive input terminal $V_{xp}$ of the first operational amplifier 300 and the positive output terminal $V_{outp}$ of the first operational amplifier 300. A third switch S3 is disposed between a first plate of the third capacitor $C_3$ and the negative input terminal $V_{im}$ of the first switched-capacitor circuit 30A. A fourth switch S4 is disposed between the negative input terminal $V_{xm}$ of the first operational amplifier 300 and the negative output terminal $V_{outm}$ of the first operational amplifier 300. A fifth switch S5 is disposed between the first plate of the first capacitor C1 and the first plate of the third capacitor C3.

The first, the second, the third, the fourth switches S1, S2, S3 and S4 are on in the first predetermined period, and the fifth switch S5 is off in the first predetermined period. The second and the fourth switches S2 and S4 are off first, then the first and the third switches are off, and the fifth switch S5 is on, in the second predetermined period.

The capacitors are connected to opamp input and output so as to implement signal amplification function by charge transferring. The frequency of charge transferring is controlled by switching frequency, or clock. The first predetermined period is also call sampling mode, in which the $C_1$ and C3 track input signal; The second predetermined period, the input signal is amplified. In these two predetermined period, the charges between $C_1$ and $C_2$ keep constant, that is $$V_{in}C_1 = V_{out}C_2 \tag{10}$$

which makes the amplifier coefficient equal to $$\frac{C_1}{C_2}.$$

At second predetermined period when the circuit settles down at the end of switching clock period, there is no current flows over $C_2$, so $C_2$ does not have loading effect on opamp to cause gain loss.

Figure 4A:
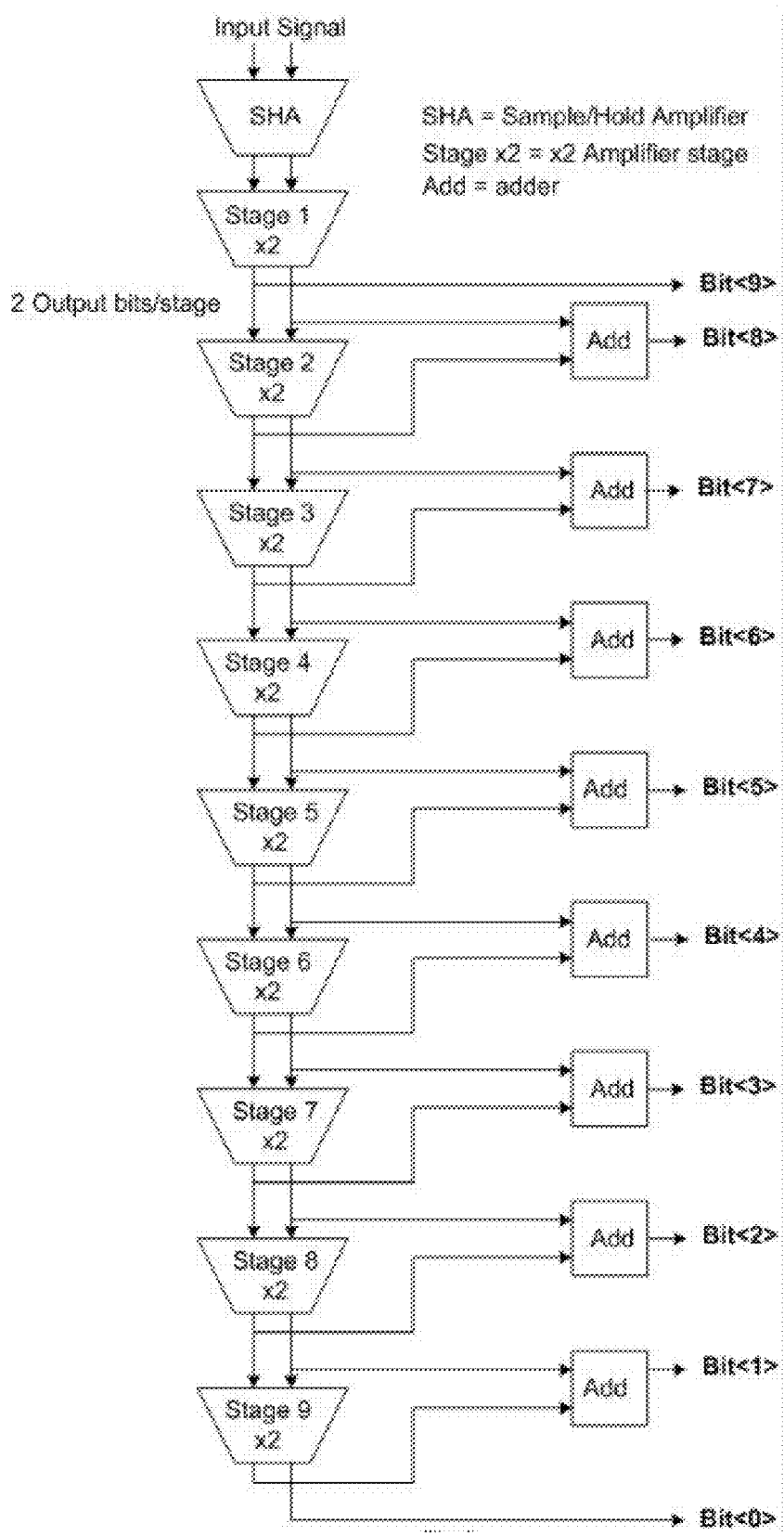
FIG. 4A is a diagram illustrating a 10-bit pipeline Analog-to-Digital Converter (ADC) incorporating the switched-capacitor amplifier according to the embodiments of the invention discussed above.

FIG. 4A is a diagram illustrating a 10-bit pipeline Analog-to-Digital Converter (ADC) incorporating the switched-capacitor amplifier according to the embodiments of the invention discussed above.

Figure 4B:
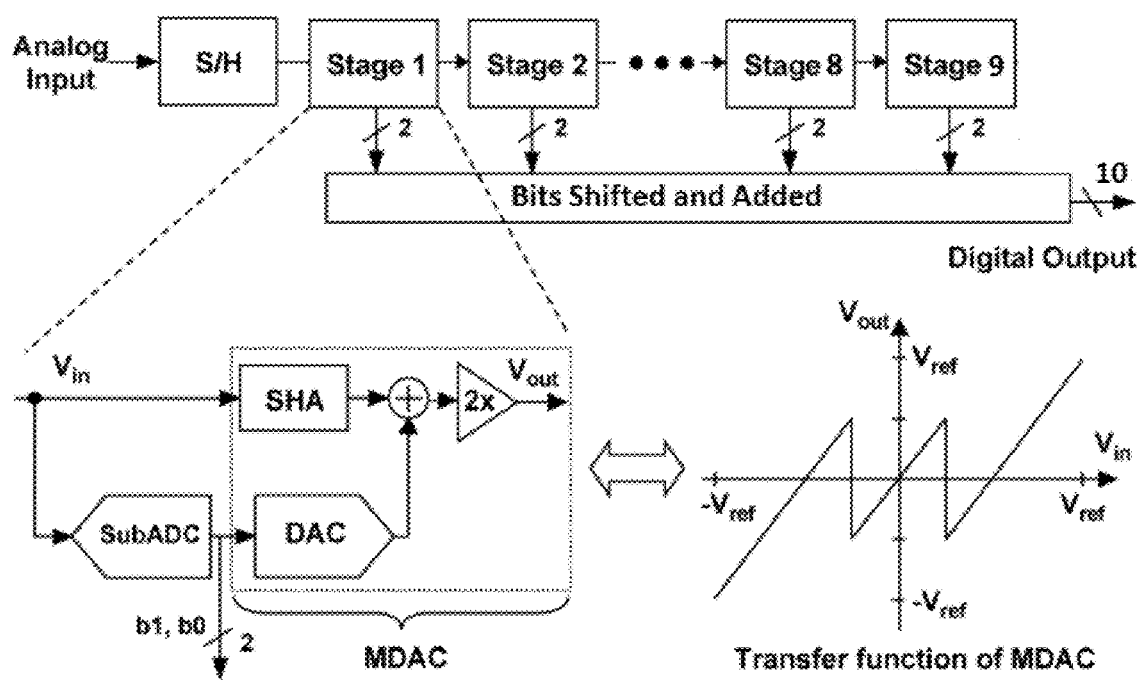
FIG. 4B is a diagram illustrating a more detailed implementation of a MDAC.

The pipeline ADC structure is illustrated in FIG. 4A, which includes a sample/hold (S/H) stage followed by nine multiplying DAC (MDAC) stages. FIG. 4B is a diagram illustrating a more detailed implementation of a MDAC. Each MDAC stage includes two comparators, a DAC and one gain-of-2 switched-capacitor amplifier. The function of MDAC is to compare the input signal with two reference levels, output two bits, and then amplify the residue by 2. Since the error is amplified by 2 at end of each stage, the first stage has higher accuracy requirement and the other stages have gradually reduced gain requirements all the way to the last stage. In this circuit, to attain 10-bit resolution target, each stage is designed to have opamp gain of 90 dB, gain-bandwidth of 1 Ghz and so the power consumption of each opamp reaches 17 mA.

Figure 5:
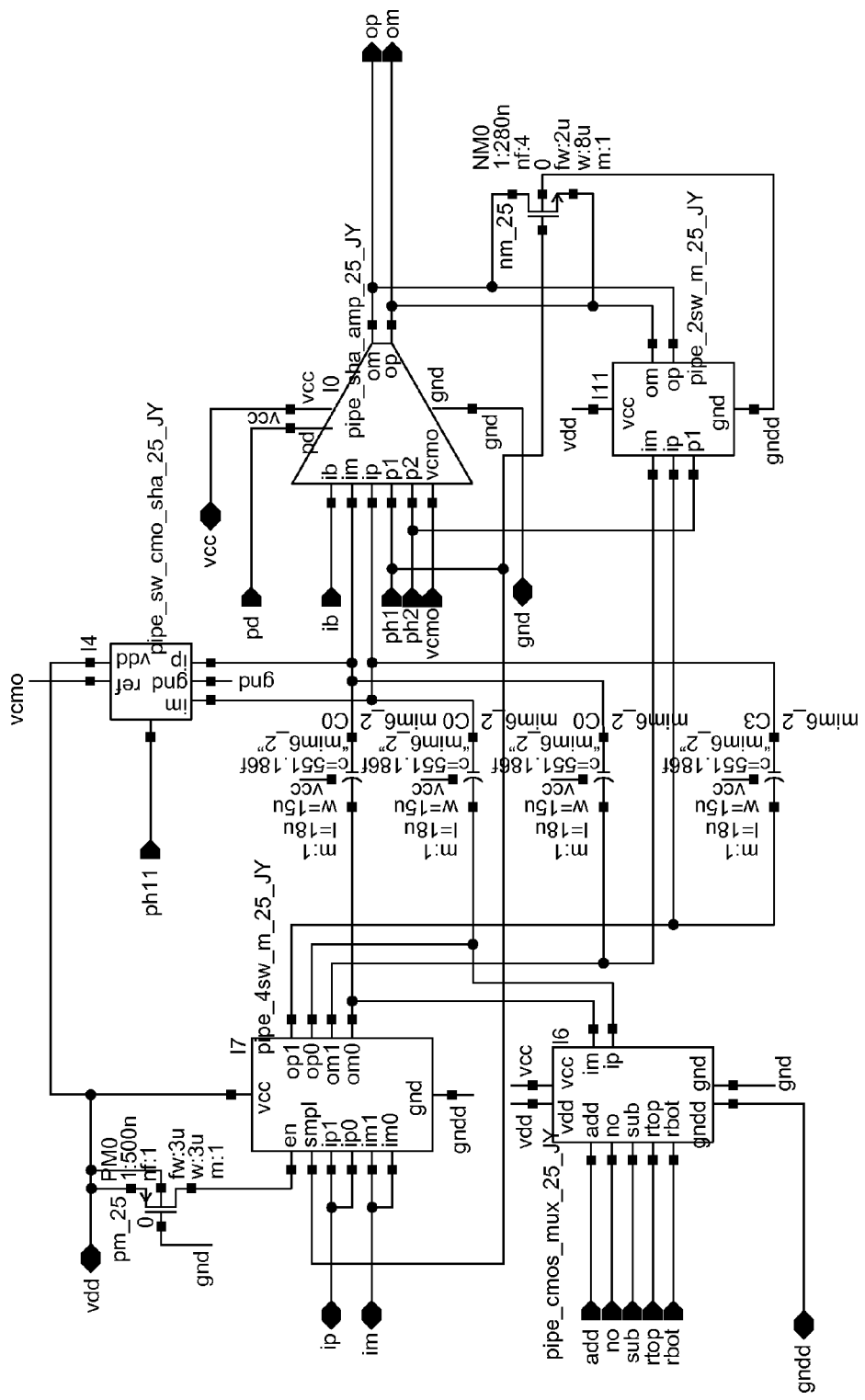
FIG. 5 shows the layout of the switched-capacitor amplifier inside each stage.

FIG. 5 shows the layout of the switched-capacitor amplifier inside each stage. It has four capacitors, two for positive inputs and two for negative inputs. At the first predetermined period, the four capacitors are all connected to input signals. Then at second predetermined period, two of them are connected to opamp output, while the other two are connected to reference voltage levels. The output of the switched-capacitor opamp depends on the input signal level relative to reference level:

$$V_{out,diff} = \begin{cases} 2V_{in,diff} + V_{ref,diff}, & \text{if } V_{in,diff} < -\dfrac{V_{ref,diff}}{4} \\ 2V_{in,diff}, & \text{if } -\dfrac{V_{ref,diff}}{4} < V_{in,diff} < \dfrac{V_{ref,diff}}{4} \\ 2V_{in,diff} - V_{ref,diff}, & \text{if } V_{in,diff} > \dfrac{V_{ref,diff}}{4} \end{cases} \quad (11)$$

From output of each stage, it can be derived that the error at Nth stage will be propagated to output with a multiplier of $2^{10-N}$. Therefore the first stage has highest accuracy requirement as the whole ADC while other downstream stages can be slackened gradually.

Based on the system requirements, conventional high-performance opamp and switched-capacitor amplifiers are used for the sample/hold and first two pipeline stages. The other seven pipeline stages are replaced with the switched-capacitor amplifiers according to embodiments of the invention. Those having ordinary skill in the art can understand that the amount of the conventional high-gain opamp and switched-capacitor amplifier can vary in the pipeline ADC circuit. For example, more or less conventional high gain opamp may be used to satisfy a target accuracy requirement of the circuit.

For the first two (or more or less) stages which use the conventional design, $C_1$ and $C_2$ are designed to be equal, that is, for example, $$C_1 = C_2 = 0.551 \text{ pF}$$

The opamp is designed to be 90 dB, so the item $$\frac{C_1 + C_2 + C_p}{A_{opamp}}$$

in equation (9) is far less than $C_2$, and can be ignored in conventional design, but the gain is still very close to the target of 2.

Figure 6:
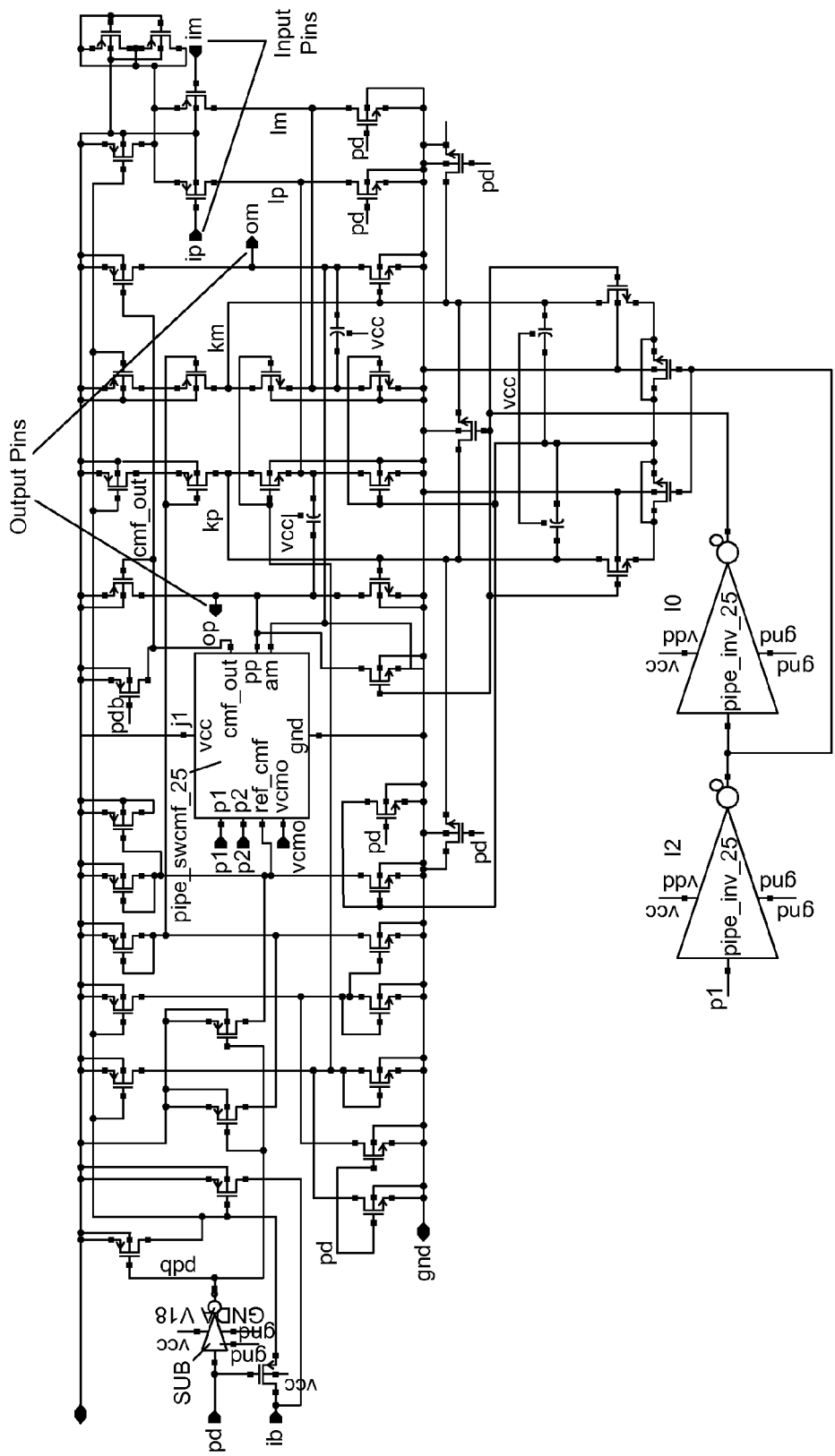
FIG. 6 shows the opamp design.

The FIG. 6 shows the opamp design with 90 dB gain. It is a 3-stage folded-cascode design, with 2 common-mode feedback loops. It also attains ~1 Ghz unit-gain bandwidth.

Figure 7:
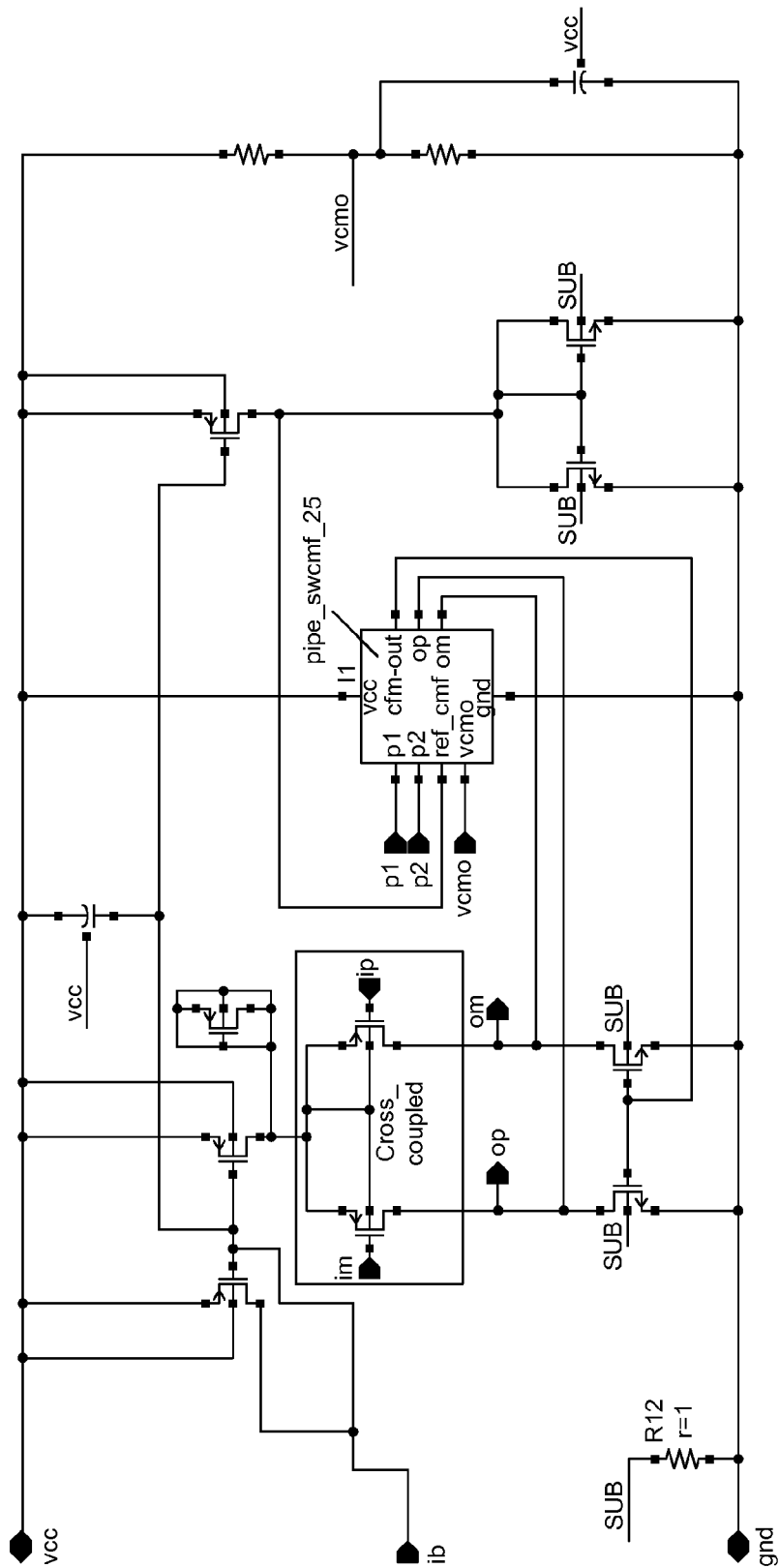
FIG. 7 shows another opamp design.

For the remaining stages, as shown in FIG. 7, with the innovative design method, $C_2$ and $C_4$ are still kept as $$C_2 = 0.551 \text{ pF}$$

The gain level of new opamp is reduce to 40 dB, or gain of 100. This requirement simplifies the opamp design by a large amount. FIG. 7 demonstrates the new opamp design, and it only has one stage with one common-mode feedback loop, compared with conventional opamp of three stages with two common-mode feedback loops shown in FIG. 6.

In this particular design, the estimated parasitic capacitance parameters from simulation is:

$$C_p = 19.07 \text{ pF}$$

Then from the equation (9), it can be derived that $$C_1 = 1.43 C_2 = 0.7879 \text{ pF}$$

Figure 8:
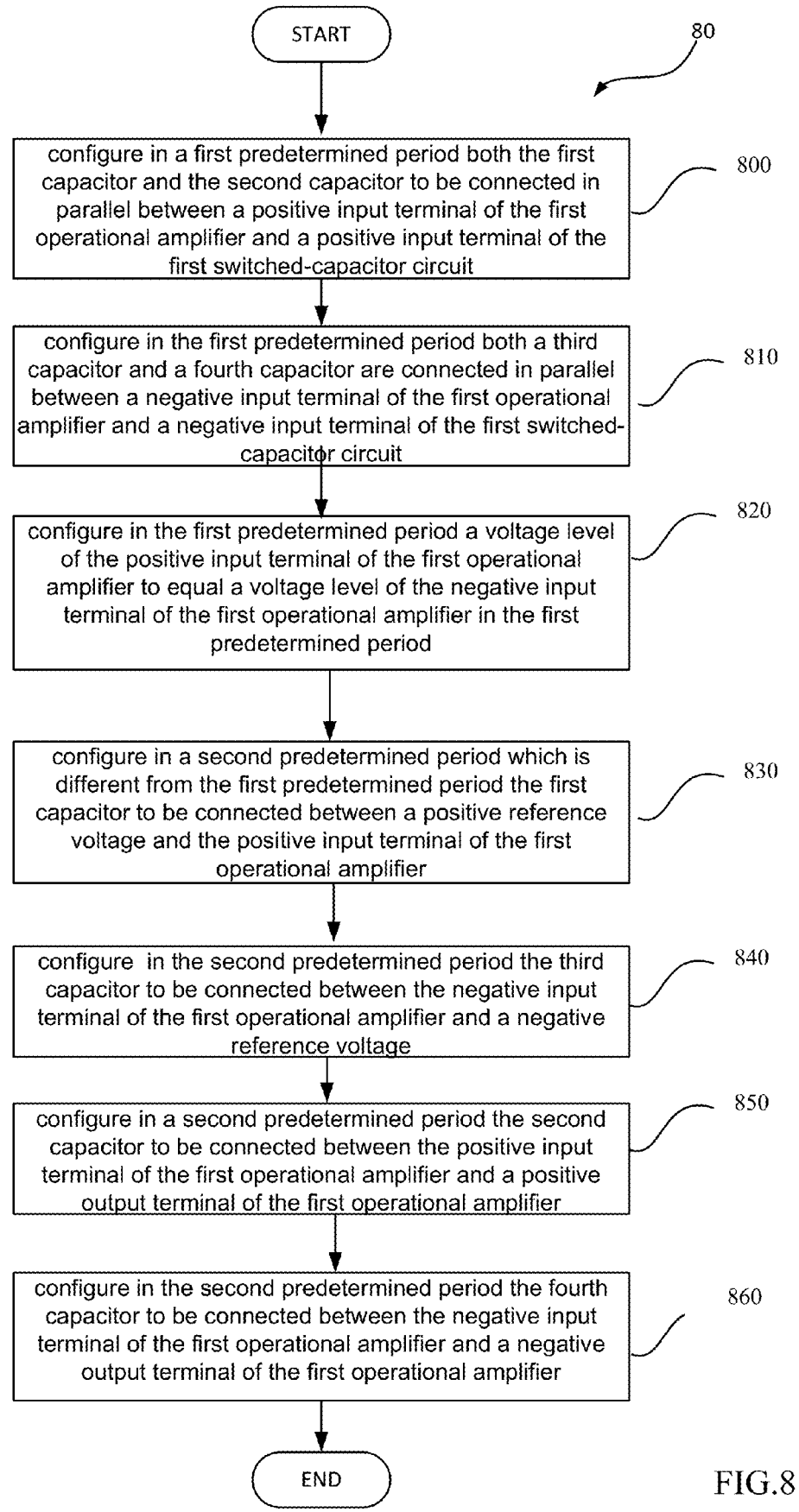
FIG. 8 is a flowchart of a method 80 according to an embodiment of the invention.

FIG. 8 is a flowchart of a method 80 according to an embodiment of the invention. The method 80 comprises configuring (in block 800) in a first predetermined period both the first capacitor and the second capacitor to be connected in parallel between a positive input terminal of the first operational amplifier and a positive input terminal of the first switched-capacitor circuit; configuring (in block 810) in the first predetermined period both a third capacitor and a fourth capacitor to be connected in parallel between a negative input terminal of the first operational amplifier and a negative input terminal of the first switched-capacitor circuit; configuring (in block 820) in the first predetermined period a voltage level of the positive input terminal of the first operational amplifier to equal a voltage level of the negative input terminal of the first operational amplifier in the first predetermined period; configuring (in block 830) in a second predetermined period which is different from the first predetermined period the first capacitor to be connected between a positive reference voltage and the positive input terminal of the first operational amplifier; configuring (in block 840) in the second predetermined period the third capacitor to be connected between the negative input terminal of the first operational amplifier and a negative reference voltage; configuring (in block 850) in a second predetermined period the second capacitor to be connected between the positive input terminal of the first operational amplifier and a positive output terminal of the first operational amplifier; and configuring (in block 860) in the second predetermined period the fourth capacitor to be connected between the negative input terminal of the first operational amplifier and a negative output terminal of the first operational amplifier. Wherein, the first capacitor equals the third capacitor, the second capacitor equals the fourth capacitor, and the first capacitor is asymmetric to the second capacitor, the third capacitor is asymmetric to the fourth capacitor. A ratio of the first capacitor and the second capacitor is a function of a simulated parasitic capacitance of the circuit, a simulated gain of the first operational amplifier, and a target gain of the switched-capacitor circuit.

Figure 9A:
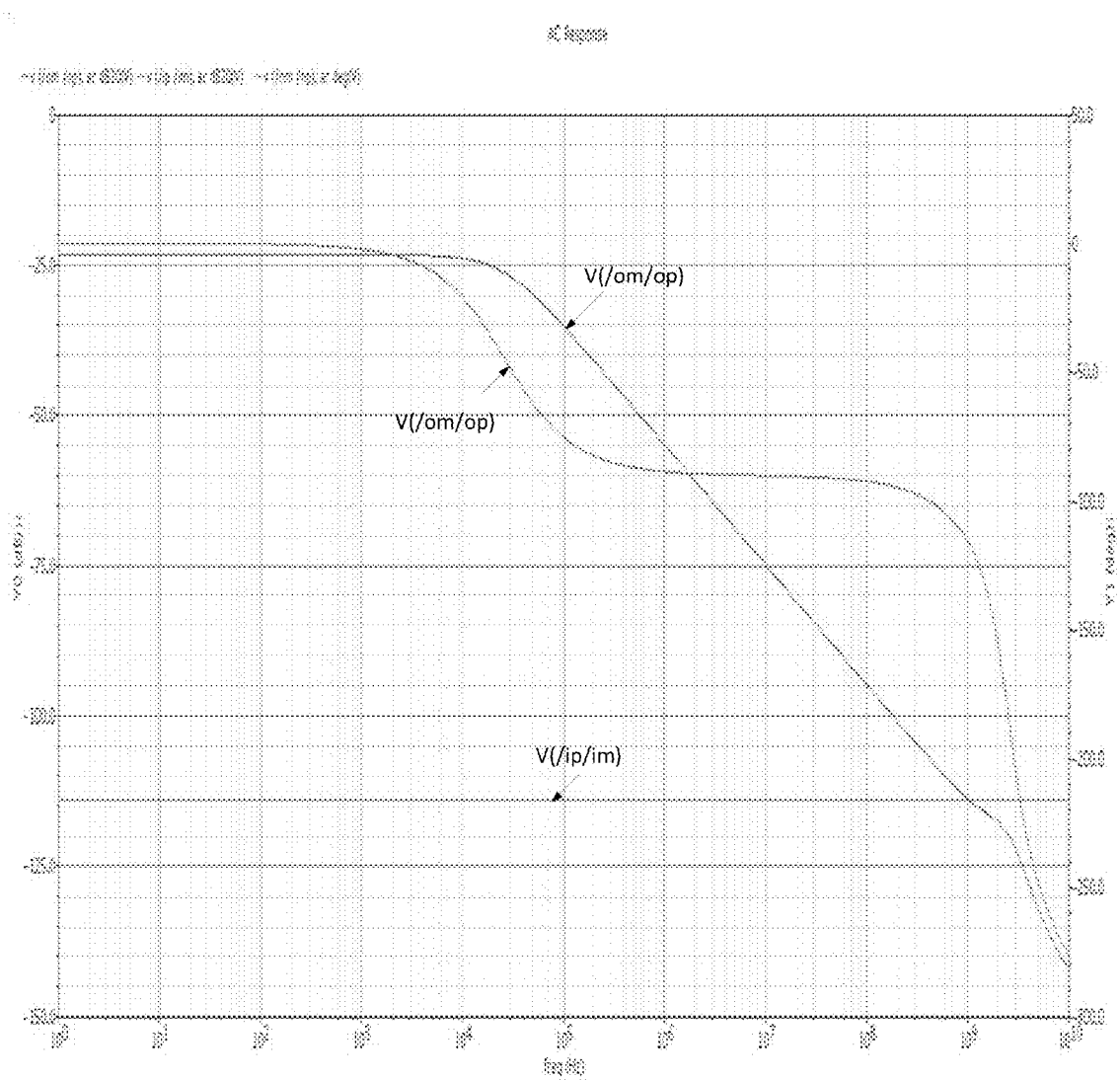
FIG. 9A and FIG. 9B are drawings illustrating the AC responses of conventional and innovative operational amplifiers according to embodiments of the invention.
Figure 9B:
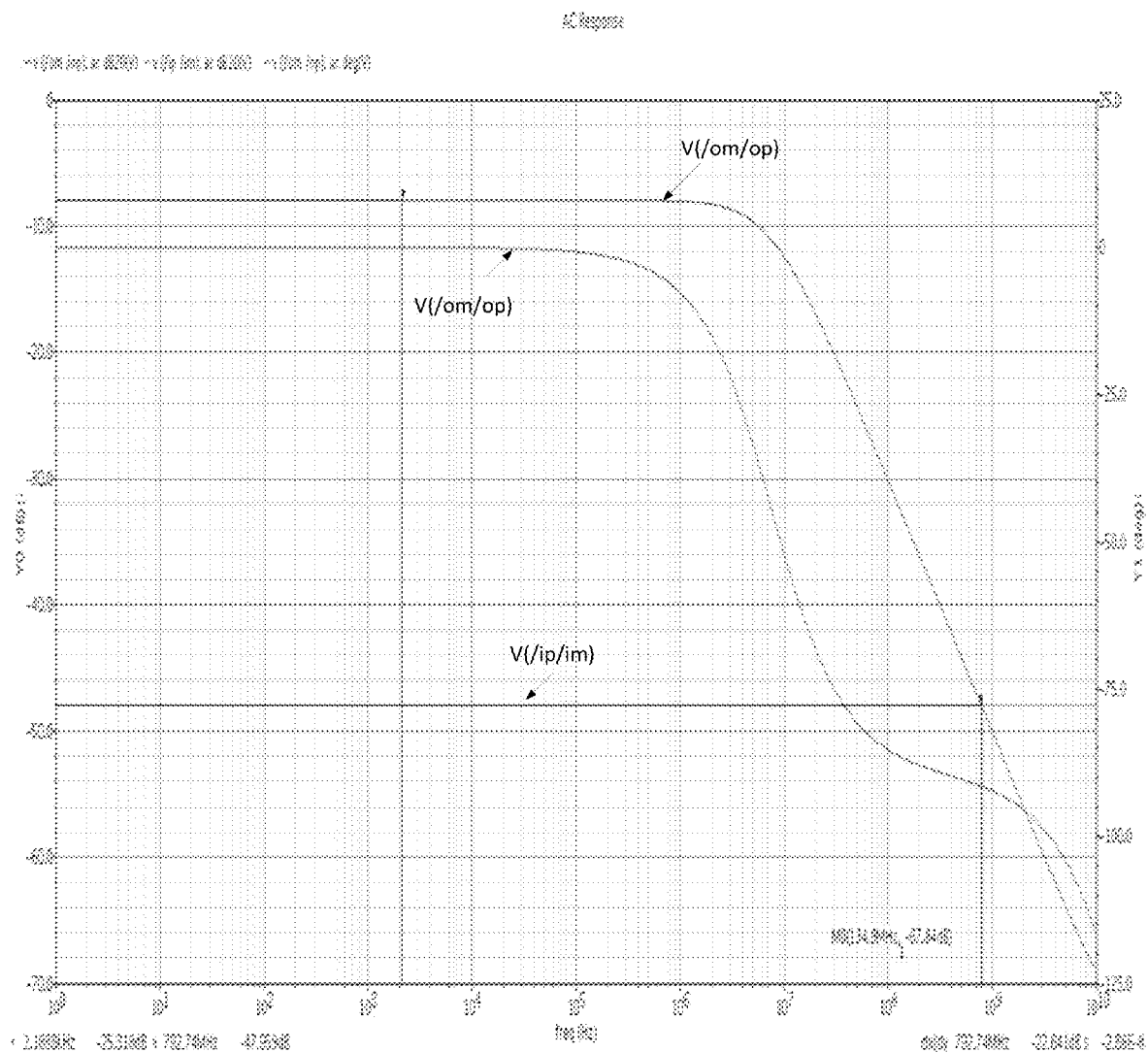

FIG. 9A and FIG. 9B illustrate the AC responses of conventional opamp and the opamp according to embodiments of the invention. FIG. 9A is for conventional opamp, it has 92.2 dB dc gain and 50 degrees phase margin (180-130 degrees). It appears to have a weak gain peak at ~2.5 Ghz. FIG. 9B is for embodiments of the invention, which has gain of 40 dB and 92 degrees phase margin which is much higher than conventional one. It does not show any gain peaking.

Figure 10A:
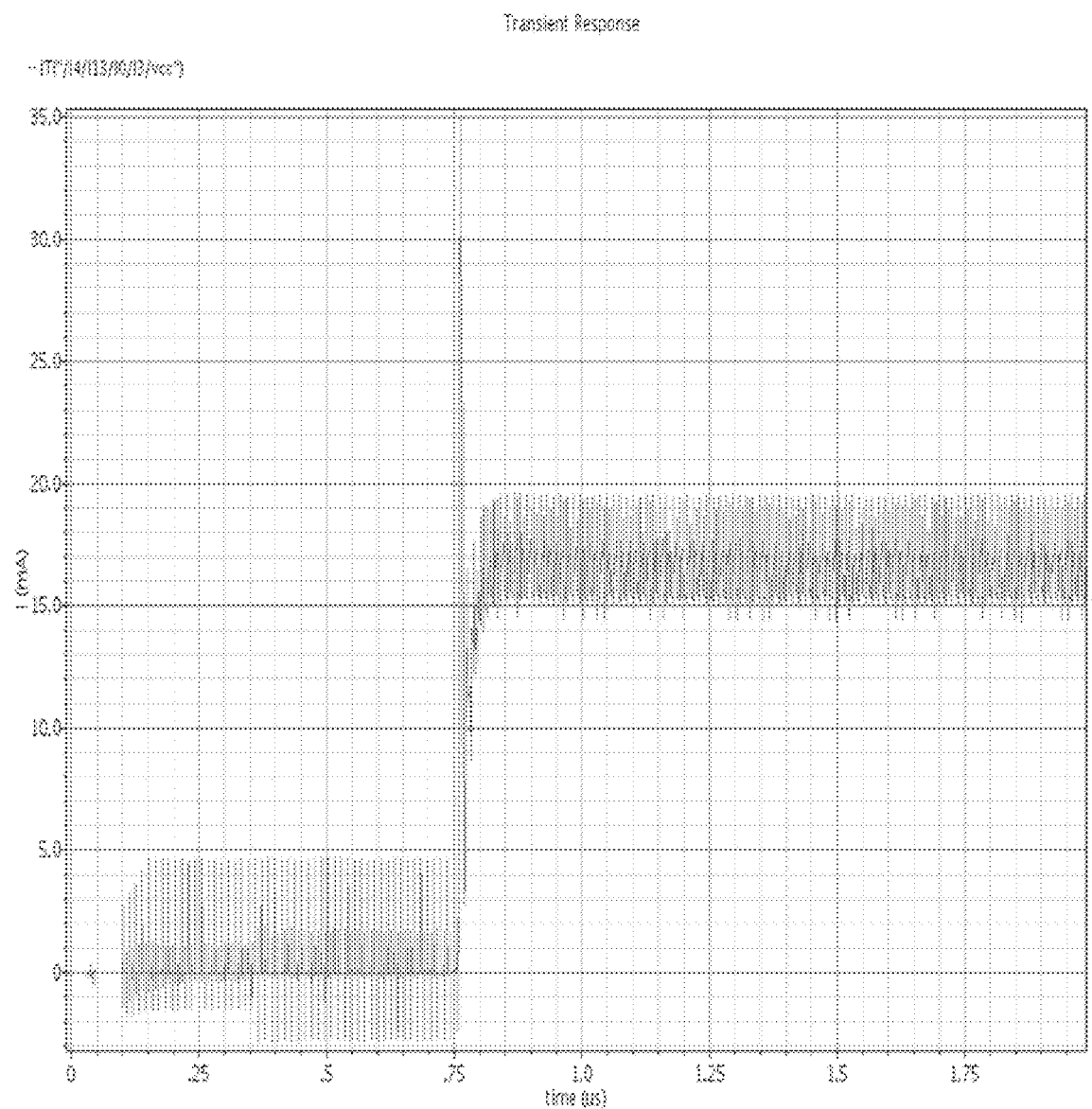
FIG. 10A and FIG. 10B are diagrams demonstrating the transient power consumption of two operational amplifiers.
Figure 10B:
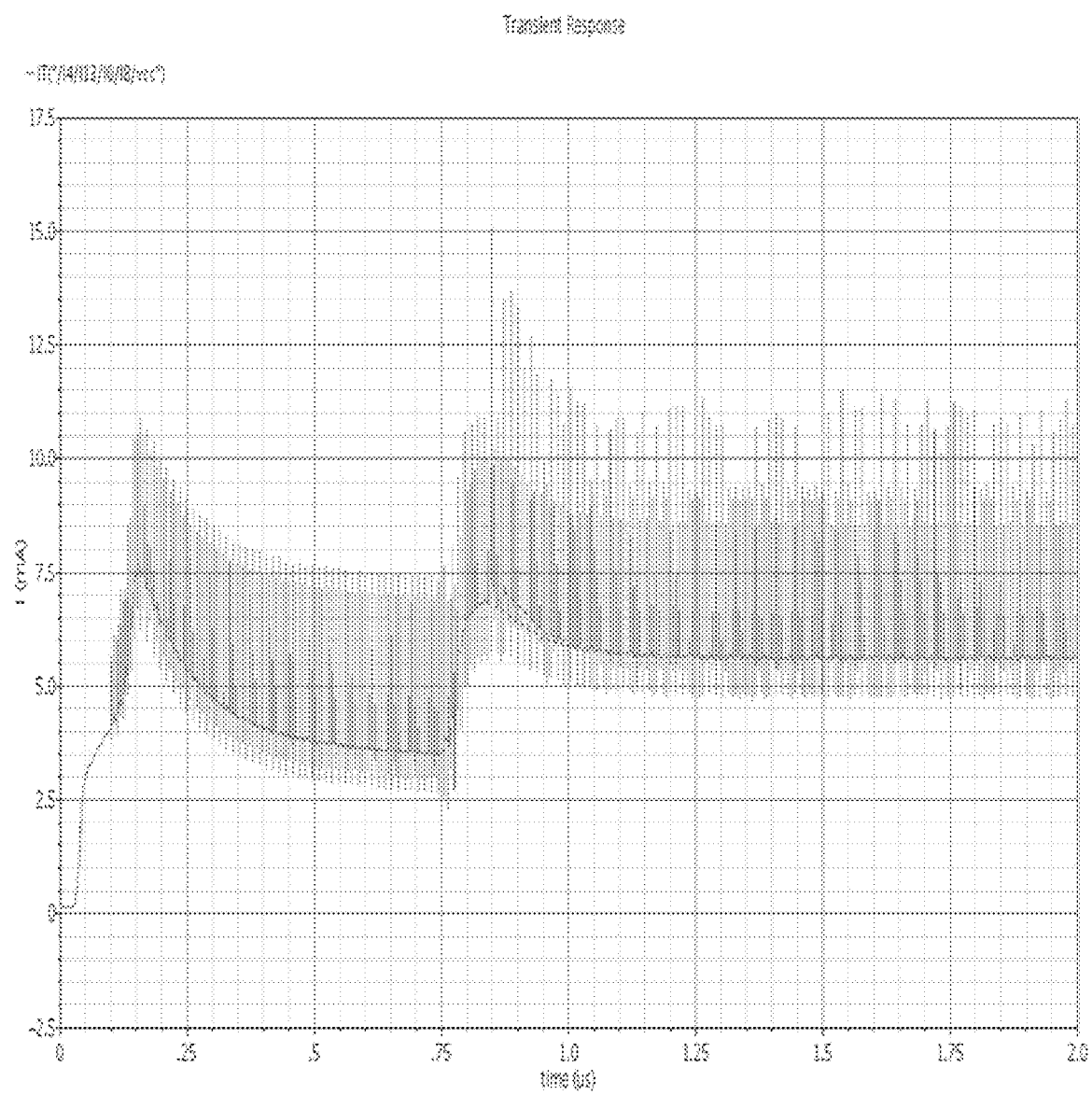

FIG. 10A and FIG. 10B demonstrate the transient power consumption of both opamps. The conventional opamp design consumes 17 mA current as shown in FIG. 10A while the new opamp absorbs only 5.7 mA, as shown in FIG. 10B. In other words, the new opamp saves 66% power than conventional one with the innovative design requirements. Since in an embodiment of the invention, seven stages replaced with the new design, a lot of power for the whole ADC is saved.

Figure 11A:
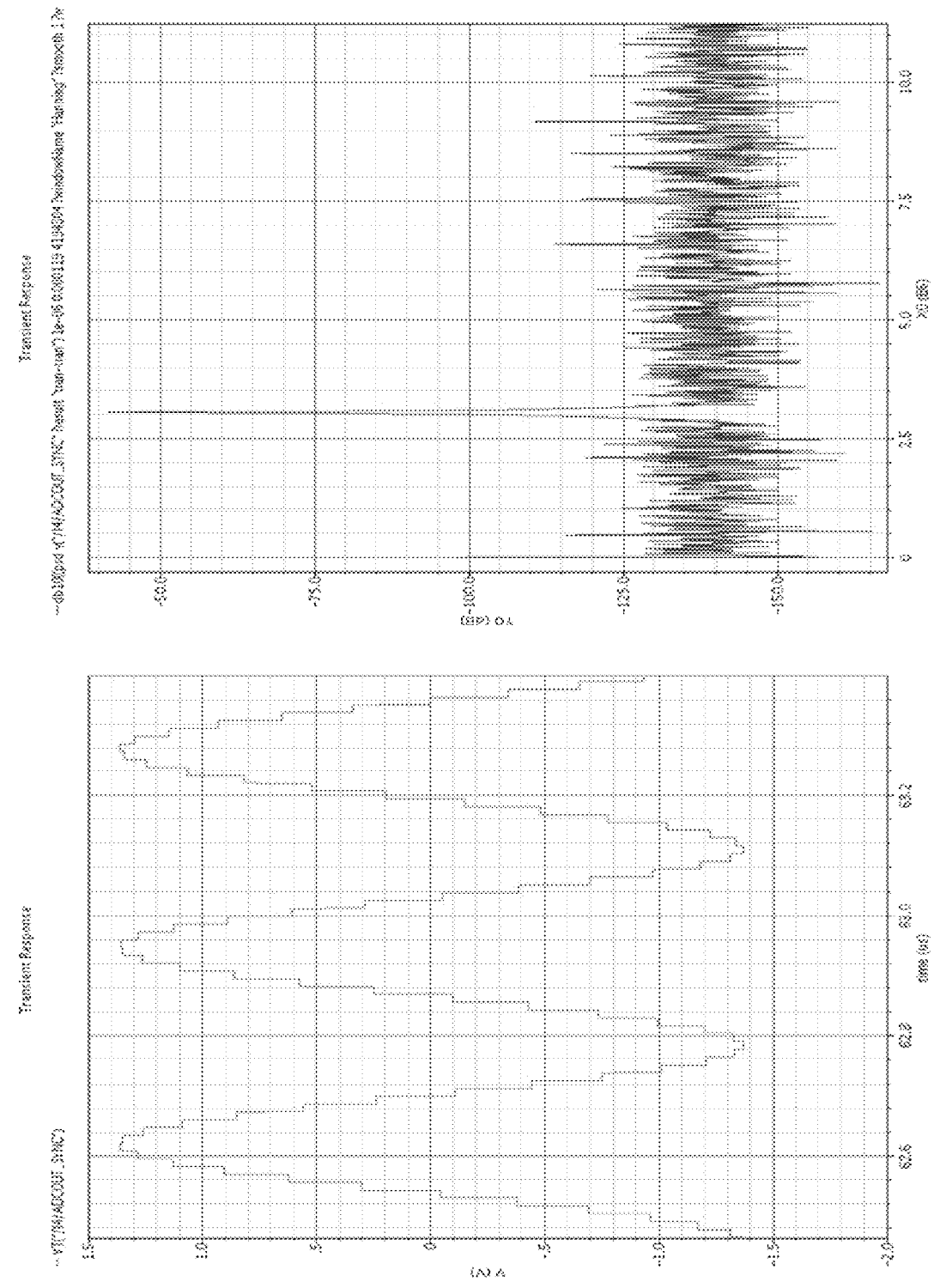
FIG. 11A and FIG. 11B show the performance for conventional pipeline ADC and the new ADC with changed switched-capacitor amplifiers. Both of them show around 67 dB SFDR.
Figure 11B:
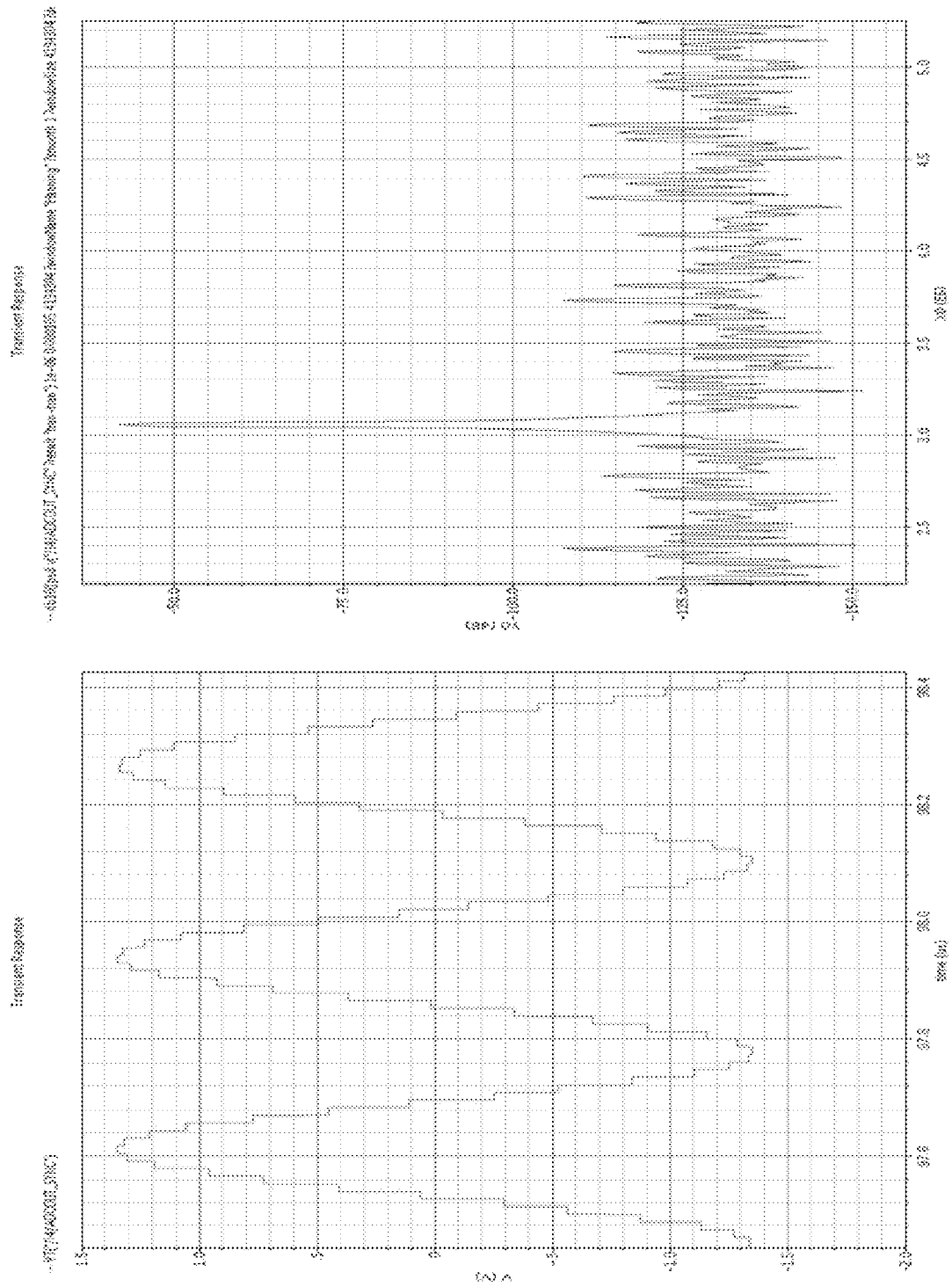

FIG. 11A and FIG. 11B show the performance for conventional pipeline ADC and the new ADC with changed switched-capacitor amplifiers. Both of them show around 67 dB SFDR.

From the foregoing, it will be appreciated that specific embodiments of the invention have been described herein for purposes of illustration, but that various modifications may be made without deviating from the scope of the invention. Accordingly, the invention is not limited except as by the appended claims.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A pipeline Analog-To-Digital Converter, comprising a sample/hold(S/H) unit, a plurality of Multiplying Digital-To-Analog (MDAC) units;

wherein at least a plurality of MDAC units comprises two comparators, a DAC and a second switched-capacitor amplifier; and the remaining at least one MDAC unit comprises two comparators, a DAC and a first switched-capacitor amplifier, wherein each of the first switched-capacitor amplifier comprises:

a first operational amplifier (op-amp);

a first capacitor;

a second capacitor;

a third capacitor; and a fourth capacitor; wherein both the first capacitor and the second capacitor are configured in a first predetermined period to be connected in parallel between a positive input terminal of the first operational amplifier and a positive input terminal of the first switched-capacitor amplifier;

both the third capacitor and a fourth capacitor are configured in the first predetermined period to be connected in parallel between a negative input terminal of the first operational amplifier and a negative input terminal of the first switched-capacitor amplifier, and a voltage level of the positive input terminal of the first operational amplifier is configured in the first predetermined period to equal a voltage level of the negative input terminal of the first operational amplifier;

the first capacitor is configured in a second predetermined period which is different from the first predetermined period to be connected between a positive reference voltage and the positive input terminal of the first operational amplifier;

the third capacitor is configured in the second predetermined period to be connected between the negative input terminal of the first operational amplifier and a negative reference voltage;

the second capacitor is configured in a second predetermined period to be connected between the positive input terminal of the first operational amplifier and a positive output terminal of the first operational amplifier;

the fourth capacitor is configured in the second predetermined period to be connected between the negative input terminal of the first operational amplifier and a negative output terminal of the first operational amplifier; and wherein the first capacitor equals the third capacitor, the second capacitor equals the fourth capacitor, and the first capacitor is asymmetric to the second capacitor, the third capacitor is asymmetric to the fourth capacitor;

wherein a ratio of the first capacitor and the second capacitor is a function of a simulated parasitic capacitance of the switched-capacitor amplifier, a simulated gain of the first operational amplifier, and a target gain of the switched-capacitor;

wherein each of the second switched-capacitor amplifier comprises:

a second operational amplifier (op-amp);

a fifth capacitor;

a sixth capacitor;

a seventh capacitor;

an eighth capacitor; wherein both the fifth capacitor and the sixth capacitor are configured in a third predetermined period to be connected in parallel between a positive input terminal of the second operational amplifier and a positive input terminal of the first switched-capacitor;

both the seventh capacitor and the eighth capacitor are configured to in the third predetermined period be connected in parallel between a negative input terminal of the second operational amplifier and a negative input terminal; and a voltage level of the positive input terminal of the second operational amplifier is configured in the third predetermined period to equal a voltage level of the negative input terminal of the second operational amplifier; and the fifth capacitor is configured in a fourth predetermined period which is different from the third predetermined period to be connected between a positive reference voltage and the positive input terminal of the first operational amplifier; and the seventh capacitor is configured in the fourth predetermined period to be connected between the negative input terminal of the second operational amplifier and a negative reference voltage;

the sixth capacitor is configured in the fourth predetermined period to be connected between the positive input terminal of the operational amplifier and a positive output terminal of the second operational amplifier, and the eighth capacitor is configured in the fourth predetermined period to be connected between the negative input terminal of the operational amplifier and a negative output terminal of the second operational amplifier ; and wherein the fifth, the sixth, the seventh and the eighth capacitors are symmetric to each other; and wherein a ratio of the fifth capacitor and the sixth capacitor is a function of a target gain of the second switched-capacitor amplifier.

2. The pipeline Analog-To-Digital Converter of claim 1, wherein the first switched-capacitor amplifier comprises:

a first switch disposed between a first plate of the first capacitor and the positive input terminal;

a second switch disposed between a first plate of the second capacitor and the positive input terminal;

a third switch disposed between a first plate of the third capacitor and the negative input terminal;

a fourth switch disposed between a first plate of the fourth capacitor and the negative input terminal;

a fifth switch disposed between the first plate of the second capacitor and the positive output terminal of the first operational amplifier;

a sixth switch disposed between the first plate of the fourth capacitor and the negative output terminal of the first operational amplifier; and a seventh switch disposed between a second plate of the first capacitor and a second plate of the third capacitor;

an eighth switch disposed between the first plate of the first capacitor and the first plate of the third capacitor; wherein the first, the second, the third, the fourth and the seventh switches are on in the first predetermined period, and the fifth, the sixth and the eighth switches are off in the first predetermined period; and the first, the second, the third, the fourth and the seventh switches are off in the second predetermined period, and the fifth, the sixth and the eighth switches are on in the first predetermined period.

3. The pipeline Analog-To-Digital Converter of claim 1, wherein the DC gain of the first operational amplifier is smaller than about 40 dB.

4. The pipeline Analog-To-Digital Converter of claim 1, wherein the first operational amplifier comprises a one stage operational amplifier.

5. The pipeline Analog-To-Digital Converter of claim 1, wherein a ratio of the first capacitor and the second capacitor is a function based on the following equation:

$$G_{target} = \frac{C_1 + C_2}{C_2 + \frac{C_1 + C_2 + C_p}{A_{DC}}},$$

wherein C1 represents the capacitance of the first capacitor, C2 represents the capacitance of the second capacitor, Cp represents the capacitance of the parasitic capacitor, and ADC represents the simulated DC gain of the first operational amplifier, and Gtarget represents the target gain of the switched-capacitor amplifier.

* * * * *